(12) United States Patent
Walbracht

(10) Patent No.: US 7,321,752 B2
(45) Date of Patent: Jan. 22, 2008

(54) LINEAR AMPLIFICATION ARRANGEMENT WITH NON-LINEAR AMPLIFIER ELEMENT FOR A MOBILE RADIO DEVICE

(75) Inventor: Jörg Walbracht, Schulzendorf (DE)

(73) Assignee: Siemens AG, München (DE)

( * ) Notice: Subject to any disclaimer, the term of this patent is extended or adjusted under 35 U.S.C. 154(b) by 131 days.

(21) Appl. No.: 10/534,771

(22) PCT Filed: Jul. 14, 2004

(86) PCT No.: PCT/EP2004/051493

§ 371 (c)(1),
(2), (4) Date: May 13, 2005

(87) PCT Pub. No.: WO2005/025054

PCT Pub. Date: Mar. 17, 2005

(65) Prior Publication Data
US 2006/0014502 A1    Jan. 19, 2006

(30) Foreign Application Priority Data
Sep. 4, 2003   (DE) ............................... 103 40 812

(51) Int. Cl.
*H01Q 11/12* (2006.01)
*H04B 1/04* (2006.01)

(52) U.S. Cl. .................. 455/127.1; 455/127.2; 455/127.5; 455/108; 455/110; 330/255; 330/262; 330/265; 330/276; 330/55; 330/122

(58) Field of Classification Search ............... 330/107, 330/140, 255, 262, 265, 276, 55, 122; 455/126, 455/205, 110, 127.1, 127.2, 127.5, 108
See application file for complete search history.

(56) References Cited

U.S. PATENT DOCUMENTS

| 3,573,645 A | * | 4/1971 | Wheatley, Jr. ............... 330/273 |
| 3,906,401 A | * | 9/1975 | Seidel ......................... 332/151 |
| 4,772,856 A | * | 9/1988 | Nojima et al. .............. 330/251 |
| 5,083,094 A | * | 1/1992 | Forsberg .................. 330/124 R |
| 5,222,246 A | * | 6/1993 | Wolkstein .................. 455/13.4 |

(Continued)

OTHER PUBLICATIONS

Minnis et al.: "New broadband balun structures for monolithic microwave integrated circuits" Microwave Symposium Digest, 1991, IEEE MTT-S International Boston, MA> USA Jun. 10-14, 1991, pp. 425-428 XP-010037667.

*Primary Examiner*—Edward F. Urban
*Assistant Examiner*—RuiMeng Hu

(57) ABSTRACT

A system and method to optimize the efficiency of an amplifier device is provided by the including a non-linear amplifier in a mobile radio device. A phase displaced signal in relation to the input signal is respectively produced in the amplifier device with a non-linear power amplifier and in a plurality of push-pull successive phase modifiers, and the outputs of the phase modifier are connected by a passive component.

8 Claims, 1 Drawing Sheet

U.S. PATENT DOCUMENTS

| | | | |
|---|---|---|---|
| 5,568,086 A * | 10/1996 | Schuss et al. | 330/124 R |
| 5,568,088 A * | 10/1996 | Dent et al. | 330/151 |
| 5,842,140 A * | 11/1998 | Dent et al. | 455/573 |
| 5,973,559 A | 10/1999 | Alberty | |
| 6,133,788 A * | 10/2000 | Dent | 330/124 R |
| 6,311,046 B1 * | 10/2001 | Dent | 455/91 |
| 6,586,999 B2 * | 7/2003 | Richley | 330/276 |
| 6,751,265 B1 * | 6/2004 | Schell et al. | 375/269 |
| 6,889,034 B1 * | 5/2005 | Dent | 455/102 |
| 7,005,919 B2 * | 2/2006 | Petrovic et al. | 330/149 |
| 7,061,317 B2 * | 6/2006 | Petrovic et al. | 330/149 |
| 2002/0067211 A1 * | 6/2002 | Matsuyoshi et al. | 330/301 |
| 2003/0058504 A1 * | 3/2003 | Cho et al. | 359/161 |
| 2004/0192233 A1 * | 9/2004 | Mitzlaff | 455/127.1 |

* cited by examiner

LINEAR AMPLIFICATION ARRANGEMENT WITH NON-LINEAR AMPLIFIER ELEMENT FOR A MOBILE RADIO DEVICE

FIELD OF TECHNOLOGY

The present disclosure relates to a method and a device for optimizing the efficiency of an amplifier arrangement with a non-linear power amplifier, preferably in a mobile radio device.

BACKGROUND

As part of the further development of mobile radio from the GSM standard to EDGE or further on to the UMTS standard, new demands are being made on the transmission characteristics of power amplifiers. Previously, information was transmitted as pure phase information (GMSK), however, recent developments require that the amplitude be also evaluated for information transmission. This results in more stringent requirements for the transmission characteristics of power amplifiers. On the one hand the amplifier element must be linear, and on the other hand the transmission characteristics must not depend on temperature changes and operating voltage variations. However, this is not always the case using transistors. Often times linear and non-linear distortions need to be minimized. To achieve this, a pre-equalization in the base band or intermediate frequency or in the form of a closed loop such as a polar loop is implemented. However, in each case a significant balancing and/or circuit overhead is required with such an arrangement.

Accordingly, an efficient and cost-effective amplifier arrangement is needed.

BRIEF SUMMARY

The present disclosure illustrates an amplifier arrangement having a non-linear power amplifier (LV) and two successive push-pull phase modifiers (PS), where a signal offset in phase to the input signal is generated in each case. Afterwards, the phase modifiers power dissipation is converted at a passive component. The passive component is connected to the outputs of the phase modifiers. A passive component can, for example, be a load balancing resistor or a symmetrical transformer with a subsequent rectifier arrangement. After the power amplifier, the amplitude-modulated signal is divided up into two signal parts of equal size or part powers and routed via two push-pull phase modifiers. The use of a symmetrical transformer as the component is particularly advantageous. The voltage uncoupled in the symmetrical transformer in this case is forwarded to a rectifier and the direct current output by the rectifier is routed to a supply unit as charge current. One advantage of this amplifier arrangement is that the efficiency of this arrangement can be decisively improved. Furthermore, the present method and arrangement of very cost effective.

BRIEF DESCRIPTION OF THE DRAWINGS

The various objects, advantages and novel features of the present disclosure will be more readily apprehended from the following Detailed Description when read in conjunction with the enclosed drawings, in which.

DETAILED DESCRIPTION

Figure 1:
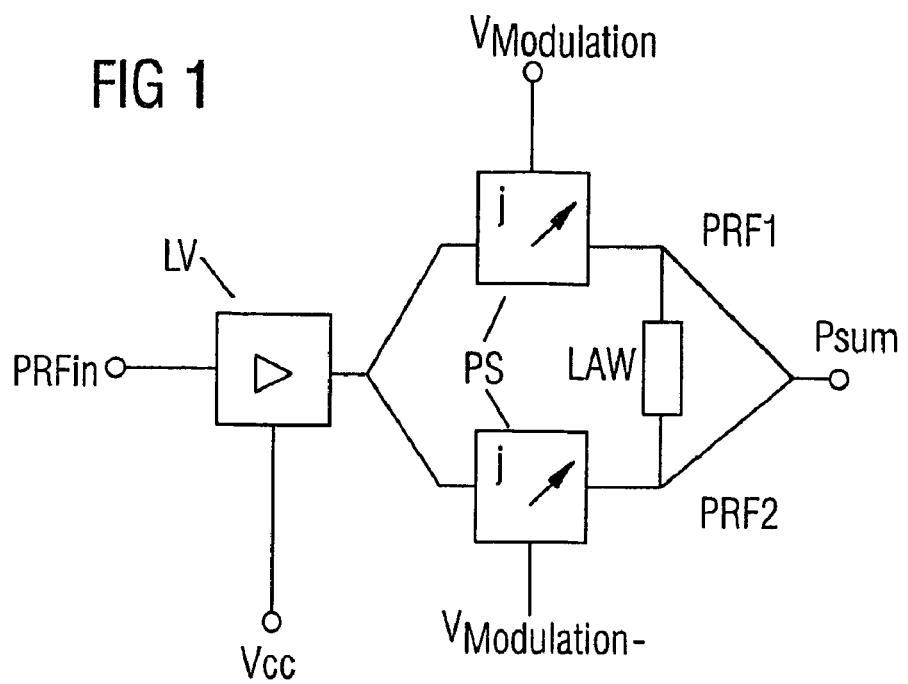
FIG. 1 illustrates a power amplifier with subsequent modulation feed and load balancing resistor.

FIG. 1 shows an amplifier arrangement for implementing a linear amplifier system with non-linear amplifier components. Two phase modifiers PS controllable with a modulation signal are connected after a C-class power amplifier LV (where efficiency can be realized in practice in the range of 75%). The circuit of FIG. 1 can be implemented with any class of amplifier (A, B or CC). However, the efficiency may be degraded with an amplifier LV operated other than in C class mode.

After the power amplifier LV, the generated signal or the power PRF is divided up into two part signals or part powers of equal size PRF 1 and PRF 2. These part powers are routed via the push-pull phase modifiers PS. In accordance with amplitude information, the power (RF) is converted as power dissipation in the load balancing resistor LAW. Amplitude information in this case is envelope curve information. The main disadvantage of this circuit arrangement also arises here. Corresponding to the crest factor (ratio of peak power to average power) the C-class power amplifier LV must be arranged for the peak power to be transmitted. However in such a circuit arrangement this leads to a large part of the RF power generated PRF being converted in the load balancing resistor LAW.

Figure 2:
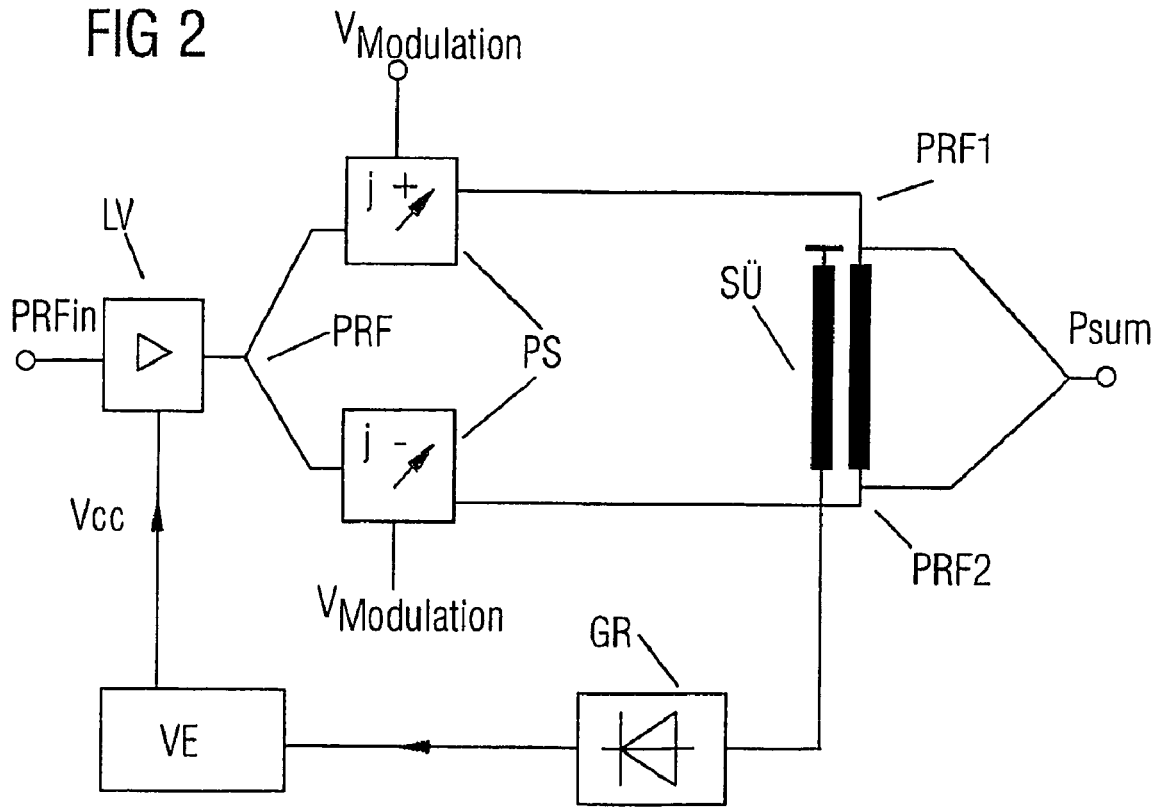
FIG. 2 illustrates an amplifier arrangement for feeding back electrical energy to a supply unit of a mobile radio device.

FIG. 2 shows a amplifier arrangement for feeding back electrical energy to a supply unit of a mobile radio device. The power amplifier LV from FIG. 1 can again be seen in this diagram operating in C-class mode with subsequent power separation PRF 1 and PRF 2 and the controllable phase modifiers PS. The circuit of FIG. 2 works with any class of amplifier (A, B or C), however the efficiency may be degraded with a power amplifier LV operated other than in C mode. Omitted from this diagram is the load balancing resistor LAW which is replaced by a symmetrical transformer SÜ (ballun). Furthermore, a rectifier arrangement GR connected to a direct current supply unit VE is added. The task of this new circuit arrangement is to route the dissipated power (HF) of the power supply unit (battery, ac adapter etc.) previously converted in the load balancing resistor LAW to a mobile radio device, and a mobile station for a cellular mobile radio network, as direct current. After the power amplifier LV, power components PRF 1 and PRF 2 are routed via the phase modifiers PS. The electrical length or the throughput time of the power components PRF 1 and PRF 2 is influenced with phase modifiers PS. Thus, as an example, power component PRF 1 is increased in path 1 by phase modifier PS, and the delay time in path 2 is reduced by the other phase modifier PS (push-pull). This is achieved through two vectors which have the same phase angle before the phase modifier PS and are different after the phase modifier PS. This produces a different length of sum vector for the addition of the two subvectors before and after the phase modifiers PS as regards the amount. The phase modifiers PS are controlled by an amplitude modulation signal, which, for example, can be an audio signal, video signal or similar information. The amplitude modulation signal can be decoupled from the input signal (useful signal). However it can also be any given signal. If the control voltage of the phase modifiers PS is not equal to zero, there is a voltage drop at the symmetrical transformer SÜ. The control voltage corresponds to the amplitude modulation signal and is thus zero when the modulation voltage is zero, via the symmetrical amplifier SU this voltage is transmitted on the secondary side of the transformer SU and referenced there to a potential. In this example, this is represented by a ground symbol. A reference to a battery potential, for example, is however also always conceivable. Subsequently, the voltage is rectified with a multipath rectifier and filtering is performed. The greatest efficiency is preferably obtained with a multipath rectifier. It would also be possible to use another rectifier. The direct current set can then be fed to the supply unit VE. To optimize the functionality of the overall circuit the input impedance of the rectifier GR should be almost independent of amplitude. If the input impedance of the rectifier is not constant, non-linear distortions are created which affect the function of the overall circuit. To transmit all signal components free of distortion, the C amplifier LV is designed for transmitting the maximum peak power occurring in the circuit. This means that the amplifier LV runs with a constant power which lies above the average power required at the output by the crest factor. With normal transmission procedures, the crest factor lies in the range 3 dB to 10 dB. If the amplifier LV is dimensioned for a crest factor of 10 dB, this means that for the arrangement with a load balancing resistor LAW (FIG. 1), appr. 90% of the generated power would be a converted in the load balancing resistor LAW as power dissipation. With the expanded circuit there is now the opportunity of capturing a this power dissipation component (HF) and feeding it to a supply unit VE as charge current. An HF (power dissipation)-DC (direct current) conversion is thus performed.

The above described description and drawings are only to be considered illustrative of exemplary embodiments, which achieve the features and advantages of the invention. Modifications and substitutions to specific process conditions and structures can be made without departing from the spirit and scope of the invention. Accordingly, the invention is not to be considered as being limited by the foregoing description and drawings, but is only limited by the scope of the appended claims.

The invention claim is:

1. An apparatus for optimizing the efficiency of an amplifier arrangement comprising:
   a non-linear power amplifier in a mobile radio device; and
   a plurality of push-pull phase modifiers coupled to said amplifier,
   wherein said phase modifiers generate a signal offset in phase from an input signal,
   wherein the outputs of the phase modifiers are coupled to a passive component,
   wherein a symmetrical transformer included in the amplifier arrangement is used as the passive component,
   wherein a voltage is decoupled in the symmetrical transformer that is rectified in a rectifier, and wherein the direct current output by the rectifier is fed to a supply unit as charge current, and
   wherein a signal generated by the power amplifier is divided into two part signals of equal size and fed to the plurality of phase modifiers.

2. The apparatus according to claim 1 wherein power is obtained at the passive component after the phase modifiers.

3. The apparatus according to claim 1, wherein an amplitude modulated signal is generated by the amplifier arrangement by means of fed amplitude information.

4. The apparatus according to claim 1, wherein the input impedance of the rectifier is amplitude-independent.

5. The apparatus according to claim 1, wherein a single-path or multipath reclifier is used as the rectifier.

6. The apparatus according to claim 1, wherein a maximum peak power arising in the power amplifier is transmitted with a deviation of up to 6 dB.

7. The apparatus according to claim 1, wherein the transmitted power of the power amplifier is up to 6 dB around the crest factor above the average power required at the output.

8. The apparatus according to claim 4, further comprising a supply unit coupled to the power amplifier, wherein the supply unit is one of a battery and an ac adapter.

* * * * *